United States Patent [19]

Ozmizrak

[11] Patent Number: 5,831,998
[45] Date of Patent: Nov. 3, 1998

[54] METHOD OF TESTCASE OPTIMIZATION

[75] Inventor: Fatma Nur Ozmizrak, Ottawa, Canada

[73] Assignee: Northern Telecom Limited, Montreal, Canada

[21] Appl. No.: 766,791

[22] Filed: Dec. 13, 1996

[51] Int. Cl.$^6$ .............................. G01R 31/28; G06F 3/00
[52] U.S. Cl. ........................................... 371/27.4; 395/500
[58] Field of Search .................................. 371/27.1, 27.4, 371/27.5, 28, 22.5; 395/183.07, 183.08, 183.09, 500; 364/148, 578, 580; 707/2

[56] References Cited

U.S. PATENT DOCUMENTS

| | | |
|---|---|---|
| 4,935,877 | 6/1990 | Koza . |
| 5,485,471 | 1/1996 | Bershteyn ............................. 371/27.2 |
| 5,542,043 | 7/1996 | Cohen et al. ...................... 395/183.08 |
| 5,604,895 | 2/1997 | Raimi ....................................... 395/500 |
| 5,664,171 | 9/1997 | Agrawal et al. ............................ 707/2 |
| 5,724,504 | 3/1998 | Aharon et al. ...................... 395/183.09 |

OTHER PUBLICATIONS

M. S. Phadke, "Quality Engineering Using Robust Design", AT&T Bell Labs, (1989), pp. 41–65 & 149–182.
B. Korte, "Approximative Algorithms for Discrete Optimization Problems", Annuals of Discrete Mathematics, vol. 4, (1979), pp. 85–120.

*Primary Examiner*—Trinh L. Tu

[57] ABSTRACT

A new method of testcase optimization for generating testcases is provided which is both efficient and effective. A 2-level heuristic is employed. The method is iterative, and at each iteration, at the first level of the heuristic, a greedy algorithm is used to select a testcase which covers the largest number of uncovered interactions from a remaining set of uncovered interactions. The second level heuristic consists of a simulation step which is employed at each iteration. Rather than conducting the greedy algorithm over an entire test domain, during each iteration the algorithm is applied over a randomly selected set of testcases. The method is efficient in the sense that a quasi-optimal number of testcases is generated which covers the most interactions with close to the fewest number of testcases. The method is effective in the sense that 100% coverage of all possible interactions is guaranteed. The method is generic in that it can be applied to any complex testing and verification task regardless of its domain.

17 Claims, 3 Drawing Sheets

METHOD OF TESTCASE OPTIMIZATION

FIELD OF THE INVENTION

The invention relates to systems and methods for generating testcases for use in testing the interaction of elements within a system to be tested.

BACKGROUND OF THE INVENTION

System life cycle analysis and management is at the foundation of customer satisfaction. An important phase of the system life cycle is testing. In testing systems consisting of a large number of interacting elements each of which can be in a number of states, it is inefficient to generate and run a testcase for each and every permutation of the states of the interacting elements. It is ineffective to randomly generate testcases because of the unlikelihood of achieving sufficient coverage.

Thus a major problem in manual and automated testing of large and complex systems is determining which testcases to run to obtain the maximum benefit with the fewest testcases. It is common to define a test coverage goal which is more practical than exhaustive coverage in the sense that far fewer testcases are required to achieve the goal, and to use computer implemented methods to generate testcases which satisfy the defined test coverage goal.

One test goal which has been used in the past is pairwise coverage of interacting states. To achieve this, each possible pair of interacting states must exist in at least one testcase. Orthogonal design techniques have been disclosed in M. S. Phadke, "Quality Engineering Using Robust Design", AT&T Bell Labs, 1989, in which each pair of interacting states must exist exactly the same number of times in the set of testcases. This is problematic in that for many systems of practical interest, no orthogonal solution exists.

In another example of using pairwise coverage of interacting states, U.S. Pat. No. 5,542,043 which issued on Jul. 30, 1996 to Cohen et al. and entitled "Method and system for automatically generating efficient test cases for systems having interacting elements" discloses a system and computer implemented method which does not attempt to cover all pairwise interacting states, but rather covers pairs which exist in subsets of the state space in which interactions are allowed, these subsets being referred to as relationships. For each relationship, testcases are generated using deterministic procedures which are generalized versions of projective plane procedures used for (statistical) experimental design, together with random procedures when the deterministic procedures fail, and then the testcases for all of the relationships are merged into a single set of testcases. This method is very complicated to use. Furthermore, it is not immediately clear that complete pairwise coverage is possible using this method in the case of a single relationship spanning an entire large state space array.

SUMMARY OF THE INVENTION

It is an object of the invention to provide an original and unique testcase generation system and method which also obviates or mitigates one or more of the above mentioned disadvantages.

According to a first broad aspect, the invention provides a processor implemented method for automatically generating testcases to test a system having a plurality N of test sets each having a corresponding plurality of possible values, each testcase including for each test set a single one of the corresponding plurality of possible values, each testcase belonging to a testcase domain, the method comprising the steps of: 1) defining an uncovered set of tuples each tuple defining an interaction between two or more particular values, each value selected from a different test set; 2) performing a simulation to select a testcase which maximizes the number of tuples in the uncovered set which are covered by the testcase, a particular testcase covering a particular uncovered tuple if all the values in the uncovered tuple are included in the testcase; and 3) removing the tuples covered by the selected testcase from the uncovered set.

Preferably the simulation comprises the steps of generating at random K testcases from the testcase domain, where K>=2; and selecting from the K randomly generated testcases the testcase covering the largest number of tuples in the uncovered set.

Advantageously, the method provided by the invention is generic in the sense that it can be applied to any complex testing and verification task regardless of its domain. Any software or hardware system, project or product which requires testing can benefit from the method.

The method produces a quasi-optimum number of testcases with an optimum coverage of test sets.

The method is formulated around providing a high yield set of testcases leading to reduced time for testcase design, testing and verification. It is especially suited to the regression domain where a significant number of testcases are added every week.

BRIEF DESCRIPTION OF THE DRAWINGS

Preferred embodiments of the invention will now be described with reference to the attached drawings in which.

DETAILED DESCRIPTION OF THE PREFERRED EMBODIMENTS

Figure 1:
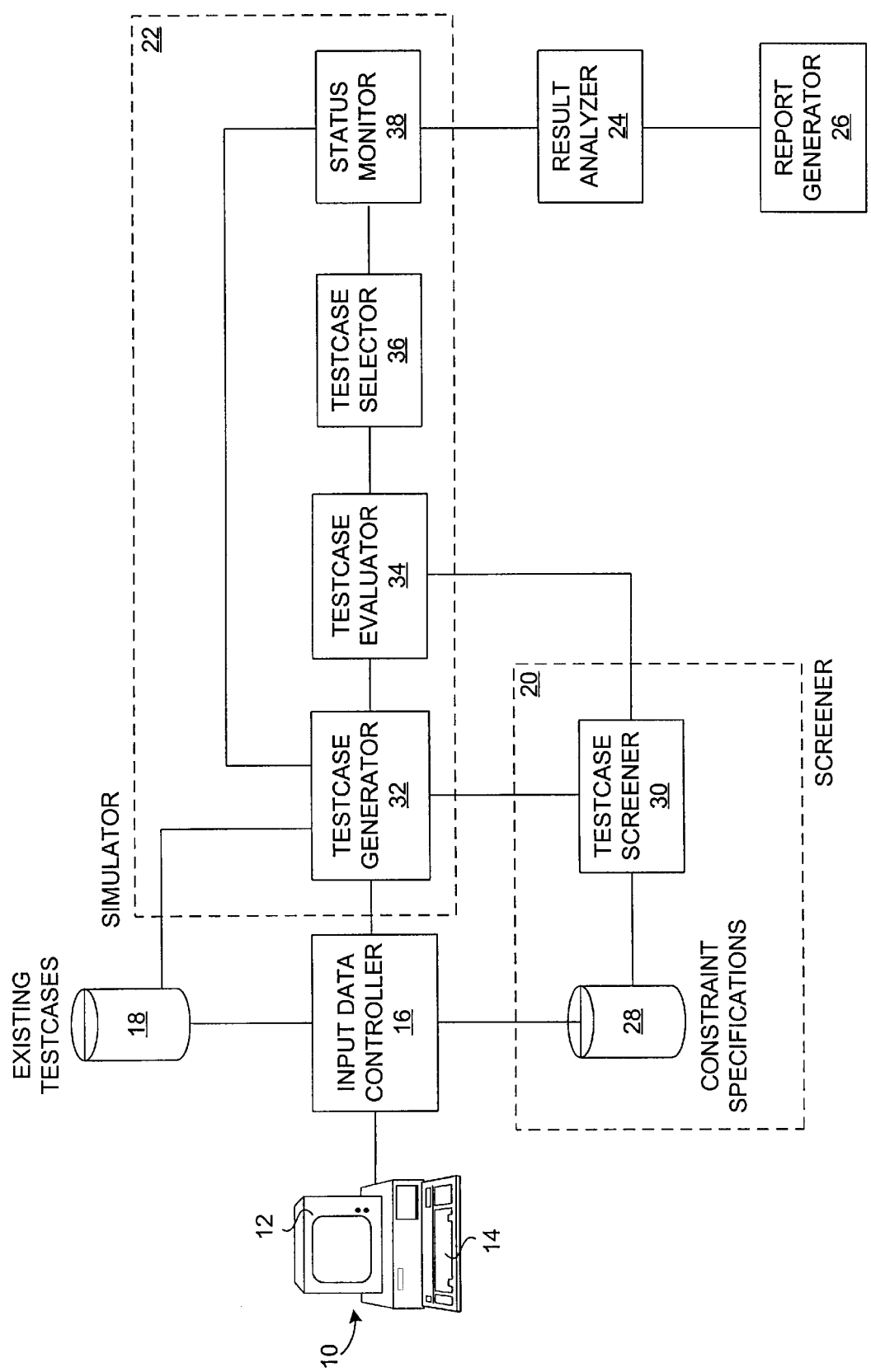
FIG. 1 is a schematic of a system for implementing the methods according to the invention.

Referring firstly to FIG. 1, a block diagram of a system for executing the method according to the invention will now be described. Shown is a user terminal 10 having a display device 12 and a keyboard 14 for a user to enter parameters. The method includes various processing steps and functions, and these may be run on the user terminal 10, or may be run on a different machine (not shown). The functional blocks used to implement the method include an input data controller 16, an existing testcases database 18, a screener function 20, a simulator function 22, a result analyzer 24 and a report generator 26. The screener function 20 includes a constraint specifications database 28 and a testcase screener 30. The simulator 22 includes a testcase generator 32, a testcase evaluator 34, a testcase selector 36, and a status monitor 38.

It is well known that a first step in any testcase generation method is to define a test space, and established techniques for carrying out this step exist. This step, which is usually carried out manually, requires a good understanding of the system under test so as to be able to produce an appropriate test space. Defining the test space first involves identifying a number N of test factors or sets. If the system under test is a mechanical system then each factor might be a different mechanical part, for example, while if the system under test is a software system then each test factor might be a different variable, for example. Then, for each of the N test sets, the possible members (values or states for that set) need to be identified. The members for a mechanical test factor might correspond to a number of possible positions for the associated mechanical part, while the members for a software variable test factor might consist of a certain set of numerical values for the associated software variable. The result is a test space for the system under test consisting of N sets $E_i$, i=1,N, each of which has $M_i$ possible members.

The testcase generation system and method according to the invention attempts to generate a testcase solution set achieving the following test coverage goals:

Goal 1) Each testcase in the solution set of testcases must contain only one member from each set. This defines a testcase domain T;

Goal 2) All the M-tuples of members from distinct sets must be covered (i.e. every M-tuple must exist in at least one testcase of the solution set of testcases). This defines a set of M-tuples to be covered, P;

Goal 3) The number of testcases in the solution set must be the minimum possible.

In the detailed description which follows, the M-tuples will consist of pairs, ie. M=2. However, the same method can be applied for larger values of M≦N.

The size of the optimum set of testcases satisfying these test coverage goals will satisfy the following relationship:

lower bound≦size of optimum set≦upper bound, where the lower bound=$M_n * M_m$, $M_n$, $M_m$ being the two largest set sizes and where the upper bound in the case $M_i$=m for i=1,N equals the minimum of:

$$\{[N(N-1)/2]m^2, m^N\}.$$

The upper bound for general $M_i$ equals the minimum of:

$$\left\{ \sum_{i=1}^{N-1} \sum_{j=i+1}^{N} M_i M_j, \prod_{i=1}^{N} M_i \right\}.$$

Figure 2:
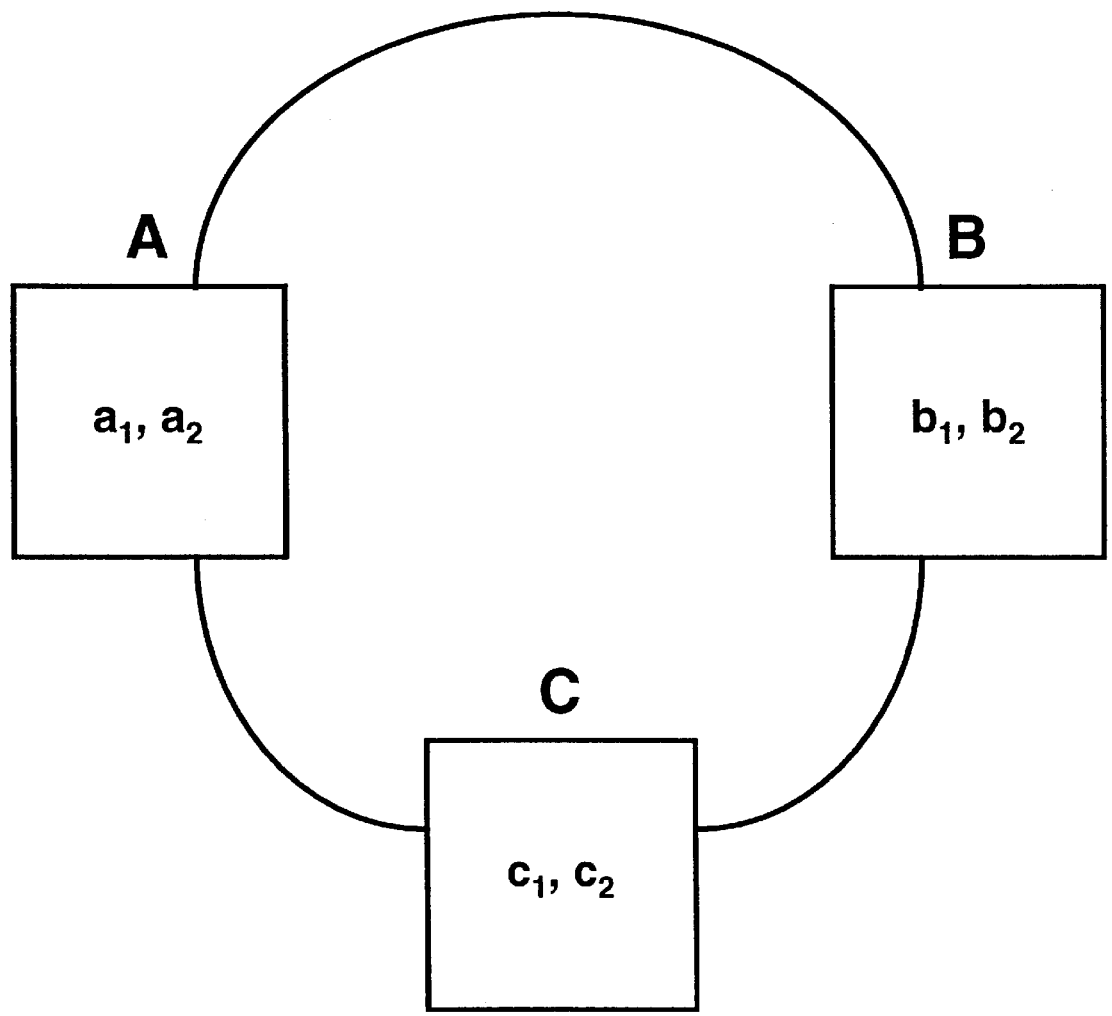
FIG. 2 is an example of test sets or factors with factor values.

In FIG. 2 an example of a system having three different elements or sets is illustrated. The three different sets are identified as A, B, and C, and each have two members. The sets of members in the sets are defined by A={a1,a2}, B={b1,b2} C={c1,c2}. In this example, N=3, and $M_i$=m=2 for i=1,N.

Goal 1 defines the domain T of possible testcases for this example to be the following:

T={(a1,b1,c1),(a1,b1,c2),(a1,b2,c1),(a1,b2,c2), (a2,b1, c1),(a2,b1,c2),(a2,b2,c1),(a2,b2,c2)}.

Goal 2 means that every possible pair must exist in a testcase, i.e. each pair must be "covered". The set of all pairs P in this example is the following:

| | |
|---|---|
| P = | { (a1, b1), (a1, c1), (a1, b2), (a1, c2), (a2, b1), (a2, cl), (a2, b2), (a2, c2), (b1, c1), (b1, c2), (b2, c1), (b2, c2) }. |

As an example of pair coverage, the testcase (a1,b1,c1) covers the pairs (a1,b1), (a1,c1), and (b1,c1), because it contains each of these pairs of members.

Goal 3 means that a minimum number of the testcases in the testcase domain defined by Goal 1 must be selected such that all the pairs defined by Goal 2 are covered by at least one testcase. The lower bound defined previously establishes the minimum number of testcases to be 2×2=4. For this simple example, an optimum solution set is as follows:

{(a1,b1,c1),(a1,b2,c2),(a2,b1,c2),(a2,b2,c1)}.

While specific goals have been defined above, these are subject to modification. For example, in Goal 1, the testcase domain may be a set of existing testcases stored in existing testcases database 18. In goal 2, for the case in which no additional constraints exist, every M-tuple must be covered at least once. Other constraints may also be stored in constraint specifications database 28. These may for example require that certain M-tuples be covered more than once, or that certain M-tuples be excluded from all testcases;

The problem of identifying the optimum solution set is very complex. The systems and methods according to the invention use a heuristic approach to tackle the problem, and come up with a solution which may be optimum in some cases, but which in general may not be optimum. In any case, 100% coverage of pairwise interactions is guaranteed. In terms of the goals defined above, goals 1 and 2 are achieved, but goal 3 may not be achieved in general.

The new approach is a 2-level heuristic approach. It is a new application of a greedy algorithm using simulation at each optimization level. Greedy algorithms, which are sometimes referred to as being myopic, are described in B. Korte, "Approximative Algorithms for Discrete Optimization Problems", Annals of Discrete Mathematics, Vol. 4, pp. 85–120, 1979, which is hereby incorporated by reference. In greedy algorithms in general, a choice is made which best satisfies a certain set of criteria at the moment in the sense that the choice is a locally optimal (greedy) choice. In many circumstances, combining a series of iteratively selected locally optimal choices will lead to a globally optimal solution, or a solution which is close to a globally optimal solution. In most cases it is much easier to find a locally optimal choice than to attempt to find the globally optimal solution. At each iteration of a greedy algorithm, an optimization operation is carried out.

The method according to the invention is a 2-level heuristic. The first level is the greedy heuristic in which an optimization is carried out at each iteration. The second level is a simulation step which is carried out at each iteration, as discussed in detail below. At each iteration, the 2-level heuristic tries to maximize (by simulation) the number of interactions (tuples) covered by the selected testcase which have not been covered thus far by previously selected testcases. The iteration process stops when all the tuples are covered (i.e. contained in at least one testcase of the solution set). This leads to a quasi-optimal solution set size, with guaranteed complete tuple coverage.

The following notation is used to describe the method. Some of this notation was introduced in the definition of the test goals above. The testcase domain T is the set of all possible testcases for N sets with set size $M_i$, i=1,N. The set P is the set of all possible unique pairs of members. Define SIM(R,t) to represent a simulation computation wherein R is a set of pairs which must be covered, in which a testcase t ∈ T is selected which maximizes the number of pairs in R covered by testcase t. This simulation computation will be described in further detail below.

As described above, before the testcase generation method may be applied, the test space definition must be performed. This will produce a set of textual definitions for the test sets and the members of the test sets. For convenience, rather than referring to the textual definitions, numerical definitions may be used. This will produce the inputs to the testcase generation method according to the invention, these inputs simply being the number of sets N, and the number of members $M_i$ in each set. These inputs may be entered with the keyboard 14 (FIG. 1), or in any other conventional manner.

Figure 3:
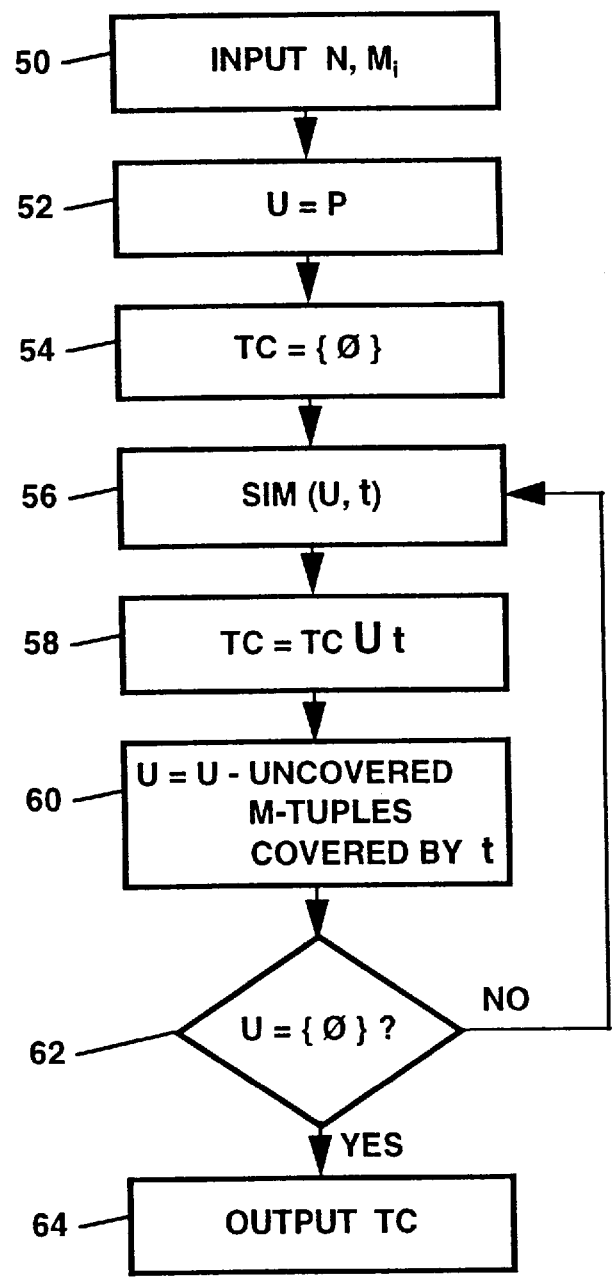
FIG. 3 is a flowchart for the method according to the invention.

The automated testcase generation method according to the invention is summarized by a flowchart in FIG. 3 and consists of the following steps:

1. Inputting N,$M_i$ for each of set (block 50);
2. Defining a set U to be a variable set consisting of all uncovered pairs. Initially, U is defined to equal the entire pair set P (block 52);
3. Define a set TC to be a solution set of testcases selected from T by the testcase generation method. Initially, this set is empty (block 54);
4. The simulator 22 conducting a simulation computation SIM(U,t) (block 56). This consists of the substeps:
   i) The testcase generator 32 generating at random K testcases from the testcase domain T, where K≧2. If a set of existing testcases exists, then the testcase generator 32 need not generate the K testcases. Instead, it may select at random K testcases from the existing testcases database 18. If constraints exist in the constraint specification database 28, than the testcases are screened by the testcase screener 30 and testcases are generated until K testcases which pass the constraint specifications have been found;
   ii) The testcase evaluator 34 determining the number of pairs in the set of uncovered pairs U covered by each of the K testcases;
   iii) The testcase selector 36 selecting from the K testcases the testcase t covering the largest number of pairs in the set of uncovered pairs U.
5. Adding the testcase t to the testcase solution set TC (block 58);
6. Removing all the previously uncovered pairs covered by t from the set U of uncovered pairs (block 60);
7. Repeating steps 4, 5, and 6 until the set of uncovered pairs U is empty (block 62); Each time these steps are repeated the status monitor 38 checks if the set U is empty. At that point, the set of selected testcases is the solution set TC and the iterative process stops;
8. The report generator 26 outputting the solution testcase set TC (block 64).

In the above, as the value K of testcases randomly generated and examined while conducting the simulation step SIM(U,t) increases, the probability of the actually finding the locally optimum testcase increases.

The solution testcase set TC may be output in any conventional method. For example, it may be printed out in hardcopy form, or may be stored in RAM or in a file on disk.

As mentioned above, while 100% pairwise coverage is guaranteed by the method, an optimum solution is not. The size of the testcase solution set generated by the method according to the invention may grow relative to the size of an optimum solution as the size of the problem instance (i.e. number of pairs) gets larger. It can be shown that an upper bound on the ratio (size of testcase solution set generated by inventive method/optimum number of testcases) is ln(number of pairs)+1.

Table 1 summarizes the number of testcases generated by the method for various N,Mi.

TABLE 1

| N | Mi | Unique Testcases | Total Pairs | Number of Testcases Generated |
|---|---|---|---|---|
| 8 | 8 | $1.7 \times 10^7$ | 1792 | 108 |
| 16 | 16 | $1.8 \times 10^{19}$ | 30720 | 654 |
| 32 | 25 | $5.4 \times 10^{44}$ | 310000 | 2361 |
| 25 | 32 | $4.3 \times 10^{37}$ | 307200 | 3469 |
| 32 | 32 | $1.5 \times 10^{48}$ | 507904 | 3879 |

An example of an application of the invention will now be described wherein the system under test is a photocopier. The test space definition has been defined to have as textual test factors the original format, original size, copy format, copy size, copy number, copy contrast level, R/E factor, paper tray, input mode and output mode. The values or members for each test factor are selected as follows, both a textual and a numerical identifier for each factor and member are provided:

| Textual Factors and values | =====> | Numerical Sets and Members |
|---|---|---|
| Test factor = Original Format | | SET 1 has 2 members: |
| Test value = Single Sided | | 1 |
| Test value = Double Sided | | 2 |
| Test factor = Original Size | | SET 2 has 3 members: |
| Test Value = 8.5 × 11 | | 1 |
| Test Value = 11 × 13 | | 2 |
| Test Value = 11 × 17 | | 3 |
| Test Factor = Copy Format | | SET 3 has 2 members: |
| Test Value = Single Sided | | 1 |
| Test Value = Double Sided | | 2 |
| Test Factor = Copy Size | | SET 4 has 4 members: |
| Test Value = 8.5 × 11 | | 1 |
| Test Value = 11 × 13 | | 2 |
| Test Value = 11 × 17 | | 3 |
| Test Value = Transparency | | 4 |
| Test Factor = Copy Number | | SET 5 has 2 members: |
| Test Value = 1 | | 1 |
| Test Value = 2 (Multiple) | | 2 |
| Test Factor = Copy Contrast Level | | SET 6 has 5 members: |
| Test Value = Extra light | | 1 |
| Test Value = Light | | 2 |
| Test Value = Normal | | 3 |
| Test Value = Dark | | 4 |
| Test Value = Extra dark | | 5 |
| Test Factor = R/E Factor | | SET 7 has 10 members: |
| Test Value = 50% | | 1 |
| Test Value = 64% | | 2 |
| | | |
| Test Value = 150% | | 9 |
| Test Value = 200% | | 10 |
| Test Factor = Paper Tray | | SET 8 has 3 members: |
| Test Value = Main Tray | | 1 |
| Test Value = Tray 1 | | 2 |
| Test Value = Tray 2 | | 3 |
| Test Factor = Input Mode | | SET 9 has 2 members: |
| Test Value = Manual | | 1 |
| Test Value = Automated | | 2 |
| Test Factor = Output Mode | | SET 10 has 3 members: |
| Test Value = Uncollated | | 1 |
| Test Value = Collated | | 2 |
| Test Value = Stapled | | 3 |

Based upon the textual and numerical identification of the test sets and members presented above, an input to a computer equipped to carry out the method according the invention will consist of entering "10" as the number of test sets, and the numbers "2,3,2,4,2,5,10,3,2,3" for the sizes of each of the 10 sets.

For these particular sets, there are a total of 86400 possible unique testcases. A theoretical lower bound on the number of testcases required to provide complete pairwise coverage is 50, while an upper bound on the number required is 556.

By carrying out the method according to the invention, the following testcases are generated, where each testcase is shown in the format:

testcase number | numerical test member for sets 1 to 10.

1 | 2 1 1 4 1 5 7 3 1 1
2 | 1 3 1 2 2 1 4 2 2 2
3 | 2 2 2 3 1 4 2 1 2 3

-continued

| testcase number | numerical test member for sets 1 to 10. |
|---|---|
| 4 | 1 2 2 1 2 2 8 3 1 1 |
| 5 | 1 1 1 3 2 3 10 1 1 3 |
| 6 | 2 3 2 2 1 3 3 2 1 1 |
| 7 | 2 1 2 1 1 1 5 1 2 2 |
| 8 | 1 3 2 4 2 5 6 2 2 3 |
| 9 | 1 3 1 3 2 4 1 3 1 2 |
| 10 | 2 2 1 1 2 2 9 2 2 2 |
| 11 | 2 1 2 2 1 2 1 1 2 1 |
| 12 | 1 2 1 4 2 1 3 3 2 3 |
| 13 | 1 1 2 4 1 4 9 2 1 1 |
| 14 | 1 3 1 4 1 3 8 1 2 2 |
| 15 | 1 2 2 2 2 3 5 3 1 3 |
| 16 | 2 1 1 3 1 1 6 1 1 1 |
| 17 | 2 3 2 1 1 2 4 1 1 3 |
| 18 | 2 2 2 1 1 5 10 3 1 2 |
| 19 | 1 3 1 2 2 5 2 1 1 1 |
| 20 | 1 3 2 3 2 2 7 2 2 2 |
| 21 | 2 1 1 3 2 5 8 2 1 3 |
| 22 | 1 3 1 4 1 2 10 2 1 1 |
| 23 | 2 3 1 3 2 4 5 2 1 1 |
| 24 | 2 1 1 1 2 3 2 2 2 2 |
| 25 | 1 2 2 1 1 4 7 1 1 3 |
| 26 | 1 2 1 2 2 4 6 3 1 2 |
| 27 | 1 2 1 1 1 3 1 2 2 3 |
| 28 | 2 1 2 3 2 2 3 1 1 2 |
| 29 | 1 2 2 4 2 5 4 3 1 1 |
| 30 | 2 3 1 2 2 3 9 1 1 3 |
| 31 | 1 2 2 4 2 1 2 3 2 2 |
| 32 | 1 3 1 2 2 4 10 1 2 1 |
| 33 | 1 1 2 3 1 1 9 3 2 1 |
| 34 | 2 1 2 3 2 3 4 3 1 1 |
| 35 | 1 2 1 4 2 5 1 3 1 1 |
| 36 | 2 3 2 2 1 3 7 3 2 3 |
| 37 | 1 3 1 1 1 2 6 1 1 2 |
| 38 | 1 1 2 1 2 5 3 2 2 2 |
| 39 | 2 1 1 2 1 4 8 1 2 3 |
| 40 | 1 3 2 4 1 2 5 1 2 2 |
| 41 | 2 3 1 2 1 1 1 1 2 3 |
| 42 | 2 2 2 4 2 4 3 3 1 2 |
| 43 | 1 3 1 1 1 5 5 3 2 3 |
| 44 | 2 3 1 4 2 2 2 1 1 2 |
| 45 | 2 1 1 3 2 1 7 2 2 1 |
| 46 | 2 2 1 2 2 5 9 1 1 1 |
| 47 | 1 3 2 4 1 1 10 1 2 3 |
| 48 | 1 2 1 1 2 3 6 2 1 3 |
| 49 | 2 3 1 1 1 1 8 1 2 1 |
| 50 | 2 3 1 4 1 5 5 2 2 3 |

In this example, the method generated a solution set of 50 testcases, and this is equal to the optimum number. As indicated previously, this is not the case in general.

As part of the output of the method, a mapping of the numerical testcases to textual testcases may be given. For example, the first testcase was represented numerically by (2 1 1 4 1 5 7 3 1 1) and this is translated into a textual testcase as follows:

Original Format—Double Sided
Original Size—8.5×11
Copy Format—Single Sided
Copy Size—Transparency
Copy Number—1
Copy Contrast Level—Extra Dark
R/E Factor—100%
Paper Tray—Tray 2
Input Mode—Manual
Output Mode—Uncollated.

In the above described method, testcases are generated which belong to a testcase domain consisting of all possible testcases. In certain circumstances, it may be that certain interactions between members of sets either are not possible or must occur in the system under test. Rather than generate spurious testcases which cover these interactions, the testcase domain may be chosen to exclude testcases which include these prohibited interactions. This is done by introducing constraints into the constraint specifications database 28. Testcases which do not satisfy the constraints are screened out by the testcase screener function 30. An exemplary constraint for the photocopier example may be expressed as follows:

If Factor Set—COPY SIZE is TRANSPARENCY then
    Factor Set—COPY FORMAT must be SINGLE SIDED.

This constraint is an implied combination constraint, meaning that if a factor value from a set (COPY SIZE) is a particular value (TRANSPARENCY), then the factor value from another set (COPY FORMAT) is limited to be a particular factor value (SINGLE SIDED). In this case, it is clear that a double sided transparency simply doesn't make sense. If during the process of randomly generating testcases, a testcase is generated with COPY SIZE= TRANSPARENCY and COPY FORMAT other than SINGLE SIDED then this case is screened by the testcase screener 30 and discarded.

Another example of a constraint may be expressed as follows:

If Factor Set—COPY SIZE is TRANSPARENCY then
    Factor Set—OUTPUT MODE cannot be STAPLED.

This is an example of a forbidden combination constraint. Clearly, it is not desirable to have stapled transparencies.

Preferably, in the algorithm described above with reference to FIG. 3, an additional step 6a) is included in the loop formerly consisting of steps 4), 5) and 6). In step 6a), a running total of the total number of pairs covered by the testcases generated thus far is maintained. This would be initialized to zero at the start of the method. Then after each simulation step, the number of uncovered pairs covered by the selected test is determined, and preferably stored in memory in connection with that testcase. That number is also added to the running total. Preferably, a value representing the percentage of pairs covered by the testcases generated thus far is also stored in connection with each testcase.

This cumulative output would be included in the output of the solution testcase set. The percentage coverage is very useful information because in some cases, regression testing for example, it may be that less than 100% of pairs coverage is appropriate. By referring to the testcases and the cumulative percentage coverage for the testcases, a set of testcases which cover a desired percentage of pairs may be chosen by selecting all the testcases in the list down until the desired percentage is exceeded. In the photocopier example, if cumulative percentage coverages are used, then the output would consist of the following:

| % coverage | testcase number | numerical test member for sets 1 to 10 |
|---|---|---|
| 8.09 | 1 | 2 1 1 4 1 5 7 3 1 1 |
| 16.19 | 2 | 1 3 1 2 2 1 4 2 2 2 |
| 24.10 | 3 | 2 2 2 3 1 4 2 1 2 3 |
| 31.29 | 4 | 1 2 2 1 2 2 8 3 1 1 |
| 37.41 | 5 | 1 1 1 3 2 3 10 1 1 3 |
| 42.99 | 6 | 2 3 2 2 1 3 3 2 1 1 |
| 48.02 | 7 | 2 1 2 1 1 1 5 1 2 2 |
| | | |
| 99.82 | 49 | 2 3 1 1 1 1 8 1 2 1 |
| 100.00 | 50 | 2 3 1 4 1 5 5 2 2 3 |

The number in the left hand column above represents for each testcase the percentage of pairs covered by that testcase and all previous testcases. Thus testcase #1 covers 8.09% of the pairs. Testcases #1 to #5 cover 37.41% of the pairs. It is noted that the methods according to the invention provide the solution testcases in decreasing order of their coverage contribution. After a solution set of testcases has been found, the result analyzer 24 may perform various analysis functions to further define the effectiveness and efficiency of the testcases generated. For example, the first F testcases of the solution set required to achieve a given percentage of pair coverage may be computed using the information accumulated during testcase generation and may be summarized succinctly as follows:

| % coverage | First F Testcases Required |
|---|---|
| 10 | 2 |
| 20 | 3 |
| 30 | 4 |
| 40 | 6 |
| 50 | 8 |
| 60 | 10 |
| 70 | 14 |
| 80 | 19 |
| 90 | 26 |
| 100 | 50 |

In this particular example, if 90% coverage of pairs is considered acceptable, then the number of testcases can be cut almost in half, from 50 to 26.

In the example described, a test goal is to cover an uncovered set consisting of M-tuples, and more specifically 2-tuples. In each simulation step, a testcase is selected which covers the most uncovered M-tuples. Other test goals may be defined which may require different simulation methods to be used. Whenever a testcase is generated which contains a number of 2-tuples, some higher order tuples are also covered, for example 3-tuples. A certain percentage of higher order tuples, such as 3-tuple coverage may also be defined as a test goal. In this case, a second uncovered set of 3-tuples may be maintained similarly to the uncovered set of 2-tuples described above, together with a record of the percentage of 3-tuples covered by the testcases generated thus far. Various options exist for selecting a testcase during the simulation step when this is the case. For example, the 3-tuple coverage information could be maintained for test coverage information only, with no input to or effect upon the testcase selection process. Alternatively, after all the 2-tuples are covered, testcases may continue to be generated until all the 3-tuples are generated. Alternatively, in the simulation step, a testcase may be selected which maximizes the number of uncovered 2-tuples or 3-tuples.

Numerous modifications and variations of the present invention are possible in light of the above teachings. It is therefore to be understood that within the scope of the appended claims, the invention may be practiced otherwise than as specifically described herein.

In the above described embodiment, a test goal was defined to cover once each a predetermined set of tuples. In many cases during the simulation step, two or more testcases will be found which cover the same number of tuples from the uncovered set. These testcases are said to be "tied". Rather than selecting one of the tied testcases randomly, additional criteria may be used to select the testcase. For example, certain tuples may be given a higher weight than others. It is desired to test these certain higher weight tuples more often than regular tuples. If these higher weight tuples are covered by one of the tied testcases and not by the others, then that testcase may be selected. Many other weighting schemes are possible.

The embodiments of the invention in which an exclusive property or privilege is claimed are defined as follows:

1. A processor implemented method for automatically generating testcases to test a system having a plurality N of test sets each having a corresponding plurality of possible values, each testcase including for each test set a single one of the corresponding plurality of possible values, each testcase belonging to a testcase domain, the method comprising the steps of:

1) defining an uncovered set of tuples, each tuple defining an interaction between two or more particular values, each value selected from a different test set;

2) performing a simulation to select a testcase which maximizes the number of tuples in the uncovered set which are covered by the testcase, a particular testcase covering a particular tuple if all the values in the tuple are included in the testcase; and 3) removing the tuples covered by the selected testcase from the uncovered set;

wherein the uncovered set of tuples consists of all possible M-tuples where $2 \leq M \leq N$.

2. A method according to claim 1 wherein the testcase domain consists of all possible testcases.

3. A method according to claim 2 wherein the simulation performed in step 2) comprises the steps of:

i) generating randomly K testcases from the testcase domain, where K>=2; and ii) selecting from the K randomly generated testcases the testcase covering the largest number of M-tuples in the uncovered set.

4. A method according to claim 1 wherein the testcase domain consists of a subset of all possible testcases.

5. A method according to claim 4 wherein the subset is defined by constraints upon permitted testcases.

6. A method according to claim 5 wherein the simulation performed in step 2) comprises the steps of:

i) generating testcases at random from the set of all possible testcases until K testcase are found which satisfy the constraints, where K>2; and ii) selecting from the K testcases the testcase covering the largest number of M-tuples in the uncovered set.

7. A method according to claim 4 wherein the subset is a set of existing testcases.

8. A method according to claim 7 wherein the simulation performed in step 2) comprises the steps of:

i) selecting randomly K testcases from the testcase domain, where K>=2; and ii) selecting from the K randomly selected testcases the testcase covering the largest number of M-tuples in the uncovered set.

9. A method according to claim 4 wherein the simulation performed in step 2) comprises the steps of:

i) generating randomly K testcases from the testcase domain, where K>=2; and ii) selecting from the K randomly generated testcases the testcase covering the largest number of M-tuples in the uncovered set.

10. A method according to claim 1 further comprising of repeating steps 2) and 3) until the uncovered set is empty.

11. A method according to claim 10 wherein the simulation performed in step 2) comprises the steps of:

i) generating randomly K testcases from the testcase domain, where K>=2; and ii) selecting from the K randomly generated testcases the testcase covering the largest number of M-tuples in the uncovered set.

12. A method according to claim 1 further comprising the steps of:
   4) counting the number of uncovered M-tuples covered by the testcase;
   5) maintaining a running total of the total number or percentage of uncovered M-tuples covered by the testcases generated thus far; and
   6) repeating steps 2), 3) 4) and 5) until a predetermined percentage of the uncovered M-tuples are covered.

13. A method according to claim 12 further comprising outputting each testcase with the respective percentage.

14. A method according to claim 13 wherein the simulation performed in step 2) comprises the steps of:
   i) generating randomly K testcases from the testcase domain, where K>=2; and
   ii) selecting from the K randomly generated testcases the testcase covering the largest number of M-tuples in the uncovered set.

15. A method according to claim 12 wherein the simulation performed in step 2) comprises the steps of:
   i) generating randomly K testcases from the testcase domain, where K>=2; and
   ii) selecting from the K randomly generated testcases the testcase covering the largest number of M-tuples in the uncovered set.

16. A method according to claim 1 wherein the simulation performed in step 2) comprises the steps of:
   i) generating randomly K testcases from the testcase domain, where K>=2; and
   ii) selecting from the K randomly generated testcases the testcase covering the largest number of M-tuples in the uncovered set.

17. A processor implemented method for automatically generating testcases to test a system having a plurality N of test sets each having a corresponding plurality of possible values, each testcase including for each test set a single one of the corresponding plurality of possible values, each testcase belonging to a testcase domain, the method comprising the steps of:
   1) defining an uncovered set of tuples, each tuple defining an interaction between two or more particular values, each value selected from a different test set;
   2) performing a simulation to select a testcase which maximizes the number of tuples in the uncovered set which are covered by the testcase, a particular testcase covering a particular tuple if all the values in the tuple are included in the testcase; and
   3) removing the tuples covered by the selected testcase from the uncovered set;
   wherein the simulation performed in step 2) comprises the steps of:
      i) generating randomly K testcases from the testcase domain, where K>=2; and
      ii) selecting from the K randomly generated testcases the testcase covering the largest number of tuples in the uncovered set.

* * * * *

UNITED STATES PATENT AND TRADEMARK OFFICE
CERTIFICATE OF CORRECTION

PATENT NO.   : 5831998
DATED        : November 3, 1998
INVENTOR(S)  : FATMA NUR OZMIZRAK It is certified that error appears in the above-identified patent and that said Letters Patent is hereby corrected as shown below:

Column, 10, line 39 (Claim 6): change K>2 to K>=2.

Signed and Sealed this

Eleventh Day of May, 1999

Attest:

Q. TODD DICKINSON

*Attesting Officer*    Acting Commissioner of Patents and Trademarks